(12) United States Patent
Paranjpe

(10) Patent No.: US 9,225,318 B2
(45) Date of Patent: Dec. 29, 2015

(54) SUB-BAND PROCESSING COMPLEXITY REDUCTION

(71) Applicant: QNX Software Systems Limited, Kanata (CA)

(72) Inventor: Shreyas Paranjpe, Vancouver (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 250 days.

(21) Appl. No.: 13/901,741

(22) Filed: May 24, 2013

(65) Prior Publication Data

US 2013/0257482 A1      Oct. 3, 2013

Related U.S. Application Data

(63) Continuation of application No. 12/696,533, filed on Jan. 29, 2010, now Pat. No. 8,457,976.

(60) Provisional application No. 61/148,661, filed on Jan. 30, 2009.

(51) Int. Cl.
  *G10L 21/00*   (2013.01)
  *H03K 5/00*   (2006.01)
  *G10L 19/02*   (2013.01)
  *G10L 25/18*   (2013.01)

(52) U.S. Cl.
  CPC .............. *H03K 5/00* (2013.01); *G10L 19/0204* (2013.01); *G10L 21/00* (2013.01); *G10L 25/18* (2013.01)

(58) Field of Classification Search
  CPC ...... G10L 21/00; G10L 21/0232; G10L 25/18
  See application file for complete search history.

(56) References Cited

U.S. PATENT DOCUMENTS 5,303,346 A      4/1994 Fesseler et al.
5,355,101 A  *  10/1994 Ichihara et al. ............... 332/103

(Continued)

FOREIGN PATENT DOCUMENTS

| | | |
|---|---|---|
| EP | 0 527 374 A2 | 2/1993 |
| EP | 1 852 848 A1 | 11/2007 |
| GB | 2 362 549 A | 11/2001 |

OTHER PUBLICATIONS

Anderson, David V.; "Speech Analysis and Coding Using a Multi-Resolution Sinusoidal Transform"; Conference Proceedings of the 1996 IEEE International Conference on Acoustics, Speech, and Signal Processing; May 7, 1996; pp. 1037-1040; XP002662475.

(Continued)

*Primary Examiner* — Daniel Abebe
(74) *Attorney, Agent, or Firm* — Brinks Gilson & Lione

(57) ABSTRACT

A sub-band processing system that reduces computational complexity and memory requirements includes a processor and a local or distributed memory. Logic stored in the memory partitions a frequency spectrum of bins into a smaller number of sub-bands. The logic enables a lossy compression by designating a magnitude and a designated or derived phase of each bin in the frequency spectrum as representative. The logic renders a lossless compression by decompressing the lossy compressed data and providing lost data based on original spectral relationships contained within the frequency spectrum.

20 Claims, 9 Drawing Sheets

(56) References Cited

U.S. PATENT DOCUMENTS

| | | | |
|---|---|---|---|
| 5,388,181 | A | 2/1995 | Anderson et al. |
| 5,388,182 | A | 2/1995 | Benedetto et al. |
| 5,394,508 | A | 2/1995 | Lim |
| 5,819,215 | A | 10/1998 | Dobson et al. |
| 6,463,405 | B1 * | 10/2002 | Case ............... 704/206 |
| 2006/0253209 | A1 * | 11/2006 | Hersbach et al. ........ 700/94 |
| 2007/0016404 | A1 | 1/2007 | Kim et al. |
| 2008/0304670 | A1 * | 12/2008 | Breebaart ............ 381/17 |
| 2011/0153314 | A1 | 6/2011 | Oxford et al. |
| 2012/0070092 | A1 | 3/2012 | Meany |

OTHER PUBLICATIONS

Miksic, A. et al.; "Subband Echo Cancellation in Automatic Speech Dialog Systems"; 5$^{th}$ European Conference on Speech Communication and Technology; Sep. 22, 1997; pp. 2579-2582; XP001045216.

Paranjpe, Shreyas et al.; "Acoustic Echo Cancellation for Wideband Audio and Beyond"; AES Convention 128; May 1, 2010; XP040509430.

European Search Report for European Application No. 14157074.7 dated Jun. 17, 2014.

* cited by examiner

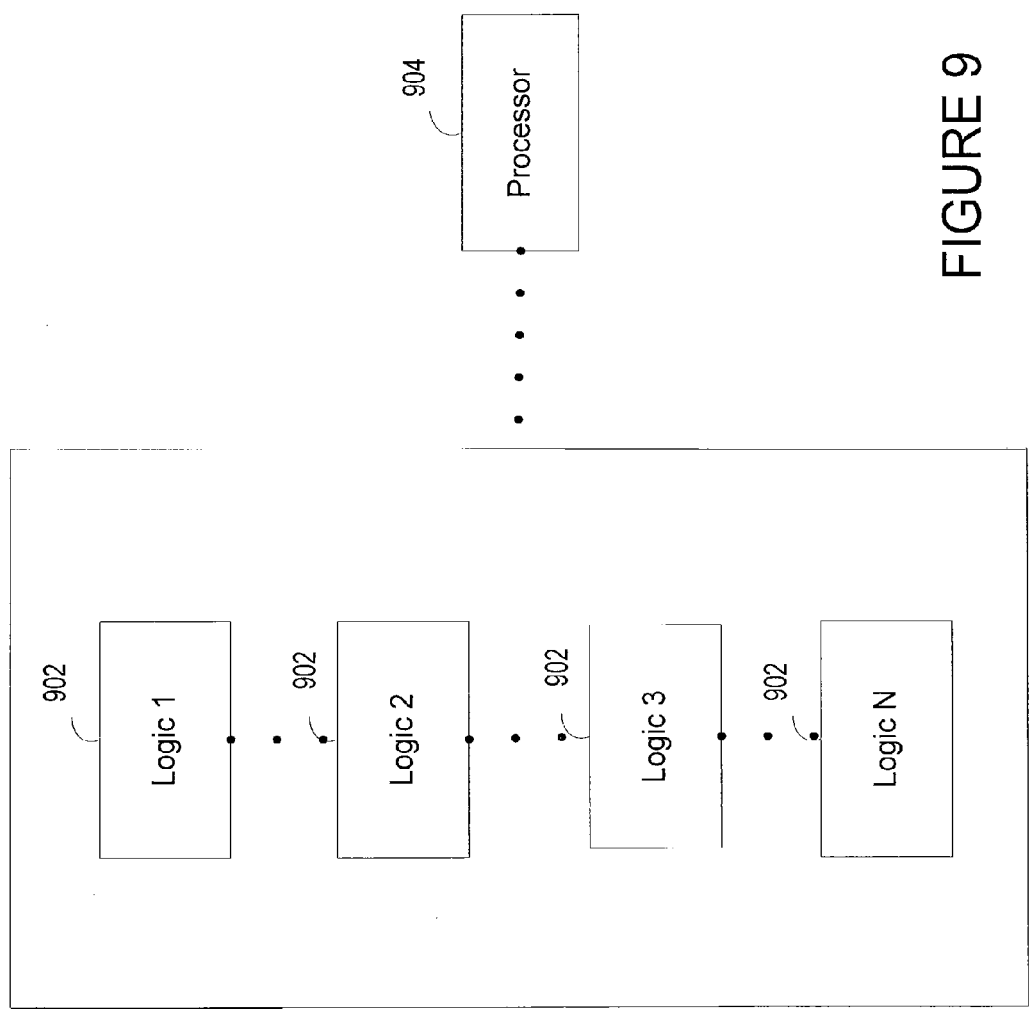

US 9,225,318 B2

SUB-BAND PROCESSING COMPLEXITY REDUCTION

PRIORITY CLAIM

This application is a continuation of U.S. patent application Ser. No. 12/696,533, filed Jan. 29, 2010, which claims the benefit of priority from U.S. Provisional Application No. 61/148,661, filed Jan. 30, 2009, both of which are incorporated herein by reference.

BACKGROUND OF THE INVENTION

1. Technical Field

This disclosure relates to sub-band processing, and more particularly to systems that reduce computational complexity and memory requirements.

2. Related Art

Wideband networks receive and transmit data through radio frequency signals through inbound and outbound transmissions. The networks may transmit data, voice, and video simultaneously through multiple channels that may be distinguished in frequency. Some wideband networks are capable of high speed operations and may have a considerably higher throughput than some narrowband networks. The increased bandwidth of these networks may increase the processing loads and memory requirements of other applications.

Frequency domain based adaptive filtering, for example, may be computationally intensive because it translates a time domain signal into multiple frequency components that are separately processed. Translating a time domain signal into multiple frequency components increases the computational complexity and memory usage of some systems when a signal's bandwidth increases. As the number of frequency components increase with bandwidth, the computational load and the required memory increase.

SUMMARY

A sub-band processing system that reduces computational complexity and memory requirements includes a processor and a local or a distributed memory. Logic stored in the memory partitions a frequency spectrum of bins into sub-bands. The logic enables a lossy compression by designating a magnitude and a designated or derived phase of each bin in the frequency spectrum as representative. The logic renders a lossless compression by decompressing the lossy compressed data and providing lost data based on original spectral relationships contained within the frequency spectrum.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 9 is an exemplary sub-band processing system.

DETAILED DESCRIPTION OF THE PREFERRED EMBODIMENTS

Figure 1:
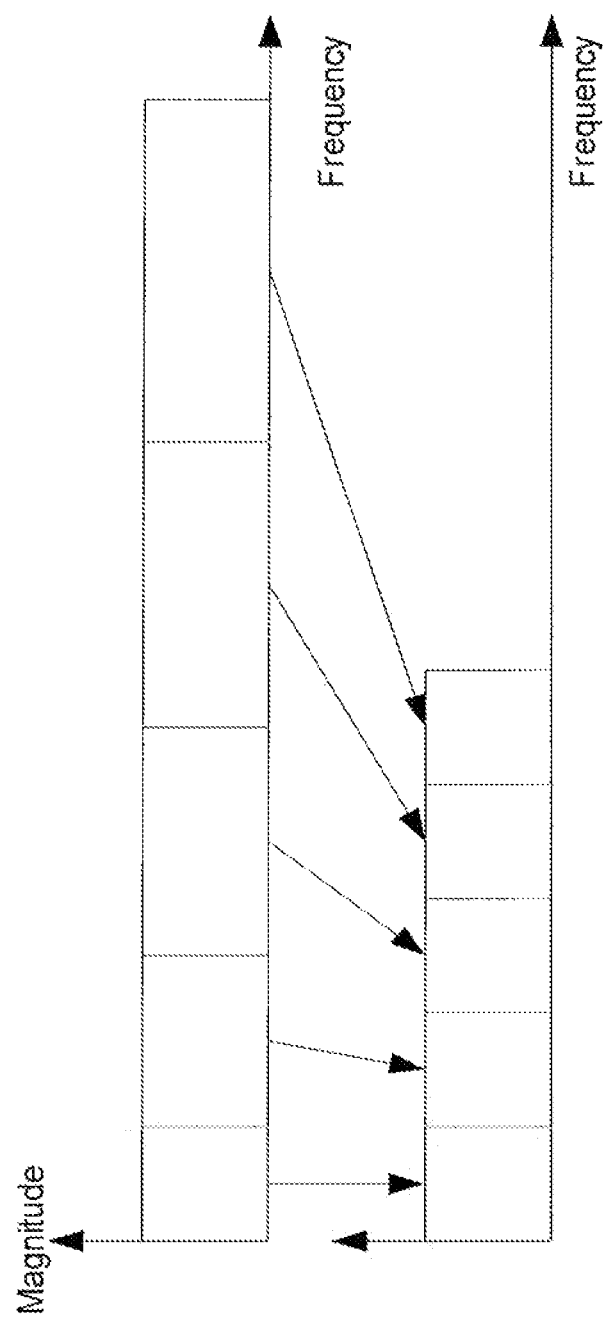
FIG. 1 is a non-overlapping frequency compression of an uncompressed frame.

Due to improvements in transmission rates and device resolutions, networks are providing multi-media, multi-point, and multiple transmission rates for a variety of services. To reduce computational loads- and memory requirements, a sub-band processing system processes data such that, after it is compressed and decompressed it is restored to its original format. The system may compress video, sound, text, code, and/or numeric data such that little or no data is lost after a bin or file is decompressed. While the data, may contain more information than may be heard or seen (e.g., perceived by a user), some systems preserve the original data (or a representative data set) while compressing and decompressing operating data through a lossy compression. After further (optional) processing (by an ancillary device or system) the sub-band processing system reconstructs and restores the data. The restored data may maintain the relative magnitude and phase of the original data. The restored data may match the original relationships (e.g., relative magnitudes and phases) frequency-for-frequency.

The sub-band processing system analysis may occur on frequency domain characteristics. To derive frequency domain properties, the signal may be broken into intervals though a multiplier function (retained in a local or a distributed computer readable medium) or multiplier device that multiplies the signal by a "window" function or a "frame" of fixed duration. To minimize spectral distortion, smooth window functions (such as Hann, Hamming, etc. retained in the local or the distributed computer readable medium) or a window filter may be used for the short-time spectral analysis. A time-to-frequency transform device, a Discrete Fourier Transform (DFT) device, or a Fast Fourier Transform (FFT) device may transform (or decompose) the short-time based signals into a complex spectrum. The spectrum may be separated into bins of magnitude and phase data or substantially equivalent complex, (e.g. real and imaginary) data. A sub-band (or band) may be represented by a single bin of magnitude and phase spectra, or a collection of consecutive or successive bins represented by a common or single magnitude and phase spectra. Table 1 shows representative characteristics of an exemplary FFT device.

TABLE 1

| | Parameters | | | | | |
|---|---|---|---|---|---|---|
| Sample rate (kHz) | 8 | 11.025 | 16 | 22.05 | 32 | 44.1 |
| FFT length (N) | 256 | 256 | 512 | 512 | 1024 | 1024 |
| Number of useful output bins (R) | 129 | 129 | 257 | 257 | 513 | 513 |
| Hz/bin | 31.25 | 43.07 | 31.25 | 43.07 | 31.25 | 43.07 |

At a sample rate of about 8 kHz, an FFT device may transform the time domain signal into about 256 bins. Due to the complex symmetry, the FFT device may yield about 129 useful bins (e.g., 256/2+1). Each bin may represent a frequency resolution of about 31.25 Hz (e.g., 8 kHz/256). The frequency resolution of other sample rates (e.g., 16 kHz and 32 kHz) may be maintained by changing the FFT length. For example, at 16 kHz, the FFT length may be about double the FFT length of the 8 kHz sample rate. At 32 kHz, the FFT length may be about double the FFT length of the 16 kHz sample rate.

In some systems, the magnitude and phase spectra may be obtained from one or more signal processors that execute a Discrete Fourier Transform (DFT) stored in a local or a distributed memory. The output of the DFT may be represented by X(k).

$$X(k) = \sum_{n=0}^{N-1} x(n) e^{j\frac{2\pi nk}{N}} \quad (1)$$

for k=0 . . . N−1, where
k is the frequency index for each bin
n is the time index for each sample
N is the length of the DFT (or FFT)

The bins (R) of the FFT (or DFT) device may partitioned into a fewer (or smaller R>=M) number of sub-bands (M). In some applications, the sub-band processing system may reduce M to a lowest possible integer that does not affect the performance or quality of a later process. In these applications, the system may generate a number of sub-bands that minimize perceptual error. The applications may exploit the sensitivity of the human auditory system or other systems that do not detect or process certain frequencies or are affected by certain signal distortions.

Figure 2:
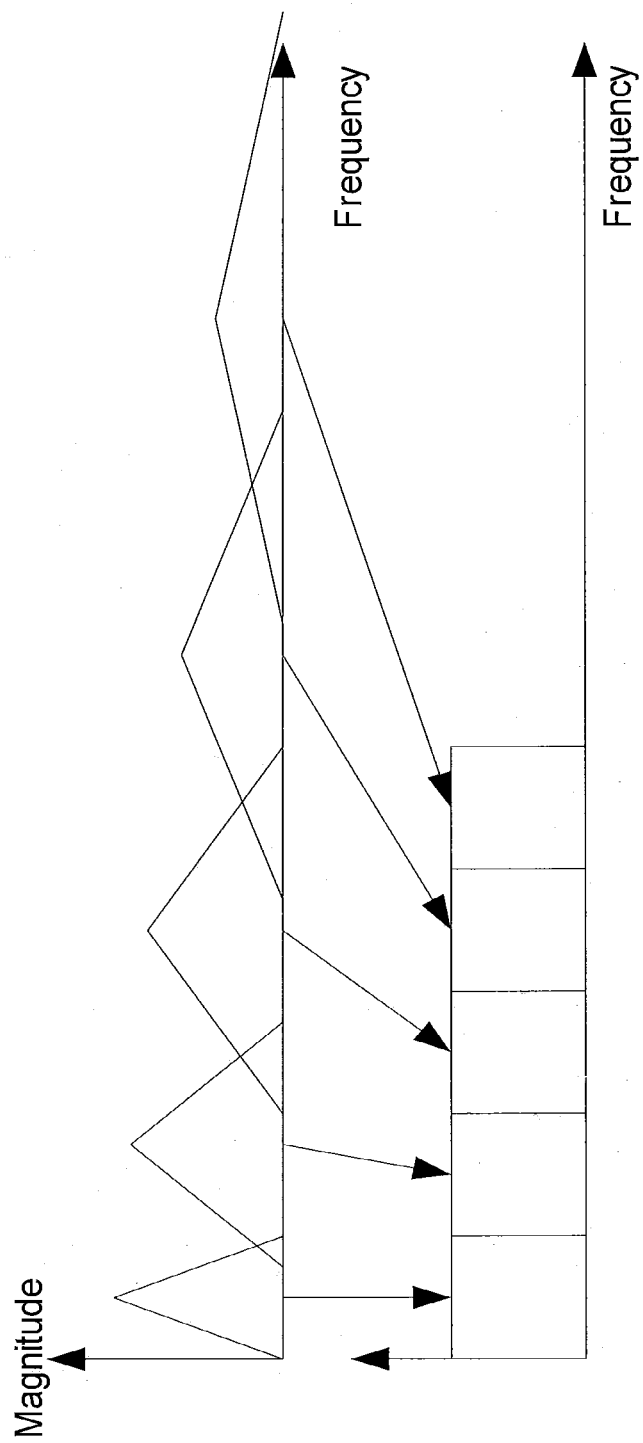
FIG. 2 is a band-like overlapping frequency compression of an uncompressed frame.

A lossy compression may compress the data such that some data is lost when the data is compressed into the sub-bands. Some sub-band processing systems compress $2^q$ bins (q is an integer) into individual sub-bands. Other systems apply a perceptual scale (through a processor or controller, for example) where the bins are grouped into sub-bands that match the frequency selectivity of the human auditory system. The sub-bands may comprise non-overlapping or overlapping frequency regions that account for a selected or critical band (e.g., a frequency bandwidth that may model an auditory filter) or apply a perceptual scale like a single or multiple stage rectangular-like bandwidth filter or filter bank, logarithmic spacing filter or filter bank, Bark filter or filter bank, Mel or Mel-like filters or filter bank. FIGS. 1 and 2, respectively, describe exemplary non-overlapping and band-like overlapping compressions. In each figure the uncompressed bins are shown above the corresponding compressed sub-bands. The compressions divide a variable sequence of uncompressed bins into a substantially equal sequence of compressed sub-bands. A substantially equal gain or a variable gain may be applied to render compressed sub-bands that are substantially flat across the frequency spectrum. Perceptual distortions may be minimized by applying lower compression ratios at lower frequencies while applying higher compression ratios at higher frequencies.

Table 2 describes an exemplary non-overlapping compression scheme in which each sub-band represents $2^q$ bins.

| Approximate freq range (kHz) | Input bin numbers | Compression ratio | Output sub-bands #s |
|---|---|---|---|
| 0-1 | 0 . . . 31 | 1:1 | 0 . . . 31 |
| 1-2 | 32 . . . 63 | 2:1 | 32 . . . 47 |
| 2-4 | 64 . . . 127 | 4:1 | 48 . . . 63 |
| 4-Nyquist | 128 . . . M | 8:1 | 64 . . . xx |

Other systems may apply a more perceptually based scheme that partitions the frequency spectrum into non-overlapping regions, in this alternative, the compression may be based on an auditory filter estimate. Each sub-band may be approximately equal to a first predetermined frequency band such as ½ ERB (Equivalent Rectangular Bandwidth) for frequencies below about 4 kHz, and a second predetermined frequency band such, as 1 ERB for frequencies above about 4 kHz. More aggressive compression schemes may be applied when the level of distortion or artifacts do not affect (or have little affect on) the performance of other systems.

Figure 3:
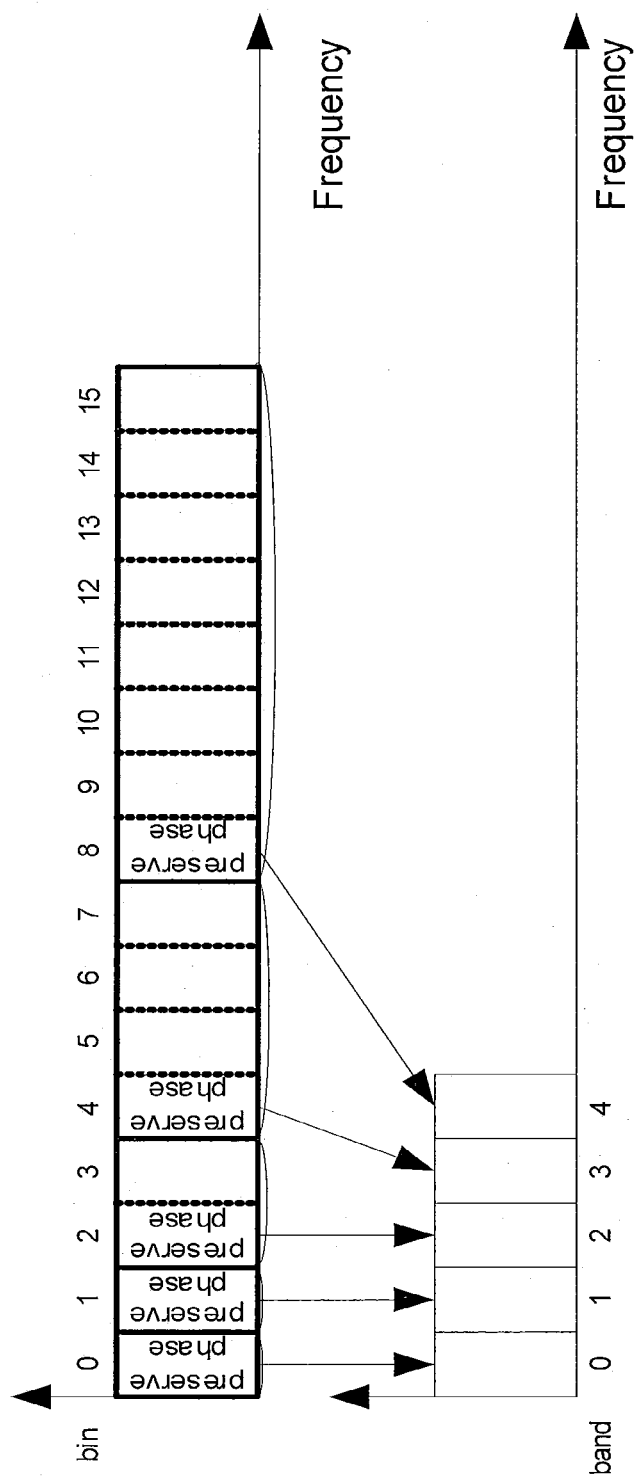
FIG. 3 is non-overlapping compression showing a phase selection.

Some systems, such as a system that may divide fifteen bins of the spectrum into five sub-bands (e.g., as shown in FIG. 3) may group sub-bands such that each sub-band is about 0.4 ERB (at a low compression) to about 0.875 (at a high compression) ERB. When there is less processor execution speed the sub-bands may be increased. If there is a need to reduce a processors speed by a millions of instructions per second (MIPS), for example, some systems increase the sub-bands to larger ERB values (e.g., each sub-band may be about 1.25 ERB)

While many lossy compression schemes may be used, the sub-band processing system may select or designate a representative phase for each sub-band. Some sub-band processing system "preserve" or select the phase of a bin within the sub-band that has the lowest frequency (as shown in FIG. 3) within that sub-band. Other systems may select bins near or at the center of the sub-band, and others may select a phase based on other structural, functional, or qualitative measures. An alternative sub-band processing system may derive phase through an average or weighted average (e.g., an averaging filter, a programmable dynamic weighting filter, a perceptual weighting filter, etc.). An average may comprise a logical operation stored in a local or remote central or distributed memory such as an arithmetic mean of the phases within each sub-band. The weights of a weighted average may be based on the phase correlations common to one or all of the bins that comprise one or more sub-bands.

The selected magnitudes, an average magnitude (e.g., an average of bins that makeup a band), peaks in the magnitude spectrum, or a function or algorithm that selects or synthesizes a magnitude of each sub-band may be designated as representative. When a maximum magnitude system is used and a maximum magnitude is detected, the bin containing that magnitude is indexed, stored in memory, and the magnitude is rotated or shifted (e.g., through a phase shifter) to attain the selected or designated phase. A resulting sub-band value may be transformed to a maximum magnitude selected from its constituent bins and the phase of the "preserved" or selected bin (through a rotation through or shift by a phase differential, e.g., $\beta_{sub\text{-}band1}$, $\beta_{sub\text{-}band2}$, etc.). In the sub-band processing system, the magnitude, |SBX(m)|, and phase, arg(SBX(m)), for each sub-band may be:

$$SBX(m) = |SBX(m)|, \arg(SBX(m)) \quad (2)$$

where $$|SBX(m)| = \max(|X(j_m)|, |X(j_m+1)|, \ldots, |X(j_m+D_m-1)|) \quad (3)$$

$$\arg(SBX(m)) = \arg(X(j_m)) \quad (4)$$

$$h_m = \arg\max(\uparrow X(j_m)|, |X(j_m+1)|, \ldots, |X(j_m+D_m-1)|) \quad (5)$$

for m=0 . . . M−1 and
m=is the index for each sub-band
$j_m$ is the starting (uncompressed frequency bin) index for sub-band m, and also the index of the bin whose phase is preserved for sub-band m
$D_m$ is the number of uncompressed bins that are "compressed" into sub-band m
$h_m$ is the uncompressed frequency index of the bin that has the maximum magnitude for sub-band m In some systems, common bins may be selected from the divided spectrum to preserve the phase of the sub-bands relative to each processed frame. In these systems $j_m$ and $D_m$ may be constant (e.g., temporally invariant) while $h_m$ may change (e.g., time variant) from one aural or sound frame (or video, sound, text, code, and/or numeric, data) to the next. Such systems may preserve the phase of the same bin within a sub-band on a frame-by-frame basis such as for example, always the first bin of a sub-band in each frame or a common bin of a sub-band in each frame.

Figure 4:
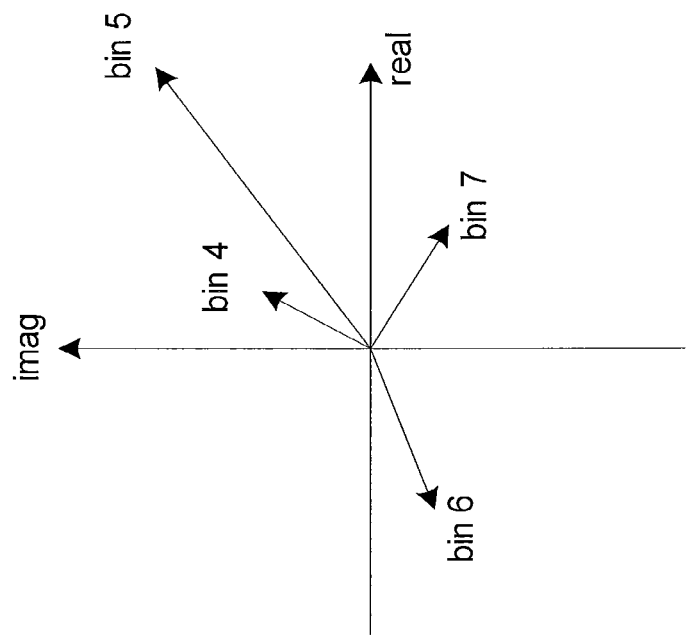
FIG. 4 is an uncompressed spectrum.
Figure 5:
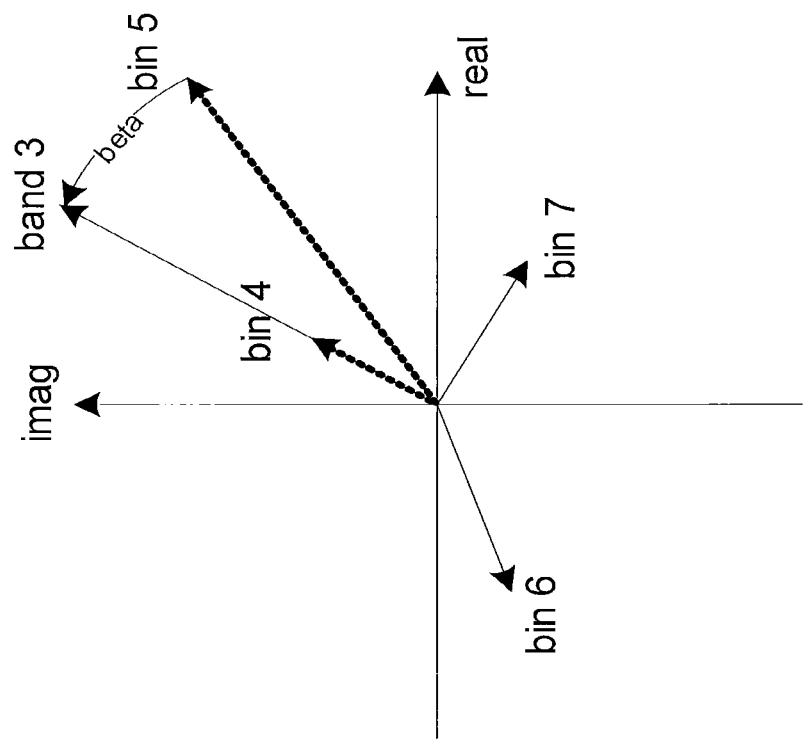
FIG. 5 is an exemplary rotation of bin 5 to the phase of bin 4.
Figure 6:
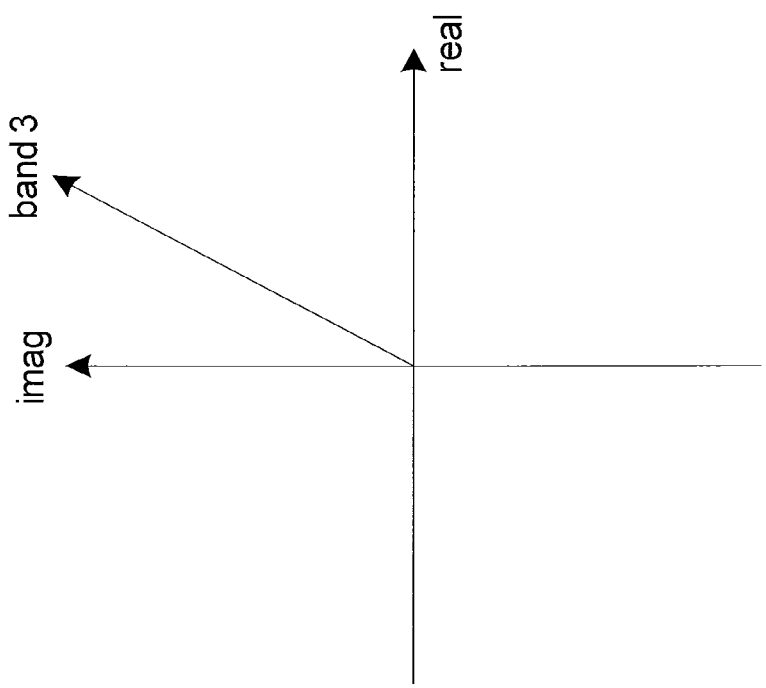
FIG. 6 is an exemplary illustration of band 3.

FIG. 4 is an uncompressed spectrum of complex vectors representing bins 4, 5, 6 and 7 that comprise an exemplary sub-band 3. In sub-band 3, bin 5 has the largest magnitude and is therefore designated as representative (e.g., through a peak magnitude detector). Through a pre-selection or a derivation through a device such as a phase detector, the phase of bin 4 is the designated phase. To preserve that phase, the vector representing bin 5 is rotated counter-clockwise or otherwise adjusted to substantially match the phase of bin 4 while maintaining its original maximum magnitude (as shown in FIG. 5). The rotated or adjusted version of bin 5 represents sub-band 3, which effectively attenuates the remaining spectrum within the sub-band (e.g., effectively setting the remaining spectrum to substantially to zero) as shown in FIG. 6. The magnitudes and phases of the sparse spectrum (e.g., the adjusted sub-band spectrum) may be further processed before the spectrum is reconstructed.

By maintaining magnitude and phase spectra through the sparse spectrum, the spectrum may be further processed in the frequency domain (or other domains). Adaptive filtering techniques or devices used by an acoustic echo canceller, noise cancellation, or a beam-former, for example, may process a consistent phase that does not change abruptly from frame to frame. Abrupt phase changes that may be a characteristic of other systems may be identified as an impulse response that causes an acoustic echo canceller to diverge. When divergence occurs, a sub-optimal, reduced, or no echo cancellation may occur due to the mismatch between the filter coefficients and the echo path characteristics. When a divergence is declared, an adaptive filter may require time to achieve a convergence.

When reconstructing the processed spectrum, the original spectral data (or a representative data set or a data set of relative measures) is processed so that little or no data is lost when the decompression is complete. By processing the original spectral data (or the representative data or relative measure data set), the sub-band processing system may achieve a lossless or nearly lossless compression. Some systems may preserve almost the entire original spectrum to avoid generating perceivable artifacts when the spectrum is reconstructed.

An overlap-add synthesis may partially reconstruct the spectrum from the processed sparse spectrum. An overlap-add synthesis may avoid discontinuities in the reconstructed spectrum. For each sub-band, the system rotates the processed sub-band to its original relative phase (or a substantially original relative phase), which is relative to the preserved bin (e.g., through a counter rotation through the phase differential, e.g., $beta_{sub-band1}$, $beta_{sub-band2}$, etc.). For example, if a bin containing the largest magnitude was rotated beta degrees in one direction, then the system rotates the processed sub-band by beta degrees in the opposite direction to restore the peak magnitude bin. With the bin restored, the remaining bins that made up the sub-band are reconstructed by maintaining relative magnitudes and phases of the original spectrum (or representative data or relative measure data set). The magnitude and phase of the remaining reconstructed bins maintain the same relative magnitude and phase relationship with the restored peak magnitude bin, as the original spectral bins had with the original peak magnitude bin. In some alternative systems, frequency-criteria may affect phase reconstruction. In one exemplary system, sub-bands that exceed a predetermined value (e.g., over about 4 kHz), may not maintain relative phase relationships.

Because further processing (e.g., echo cancellation, noise reduction, beam former, signal attenuators, amplifiers, signal modifier, etc.) may alter the magnitude and phase of each sub-band, quantitatively each SBX(m) has been transformed into SBY(m). Equations 6-10 describe how the magnitude and phase for each sub-band may be expanded to its constituent bins. Equation (7) establishes that the magnitude of the restored peak magnitude bin is equal (or may be substantially equal) to the magnitude of the processed sub-band. Equation (8) establishes that the phase of the restored peak magnitude bin maintains substantially the same relative phase relationship measured during the partitioning process. Equations (9) and (10), respectively, establish how the remaining bins may be reconstructed. Once the complex spectrum is restored, $$SBY(m) = |SBY(m)|, \arg(SBY(m)) \qquad (6)$$

$$|Y(h_m)| = |SBY(m)| \qquad (7)$$

$$\arg(Y(h_m)) = \arg(SBY(m)) - \arg(X(j_m)) + \arg(X(h_m)) \qquad (8)$$

$$|Y(p)| = |Y(h_m)| \cdot \frac{|X(p)|}{|X(h_m)|} \qquad (9)$$

$$\arg(Y(p)) = \arg(Y(h_m)) - \arg(X(h_m)) + \arg(X(p)) \qquad (10)$$

for m=0 . . . M−1 and m=is the index for each sub-band $j_m$ is the starting (uncompressed frequency bin) index for sub-band m, and also the index of the bin whose phase, is preserved for sub-band m $D_m$ is the number of uncompressed bins that are "compressed" into sub-band m $h_m$ is the uncompressed frequency index of the bin that has the maximum magnitude for sub-band m p are the indexes in the range $[j_m, j_m+D_m-1]$ that do not equal $h_m$ a time domain signal may be generated by an Inverse Fourier Transform device (or function stored in a local or a distributed memory). If windows were used during system, analysis, an overlap-add function may be used for synthesis.

Figure 7:
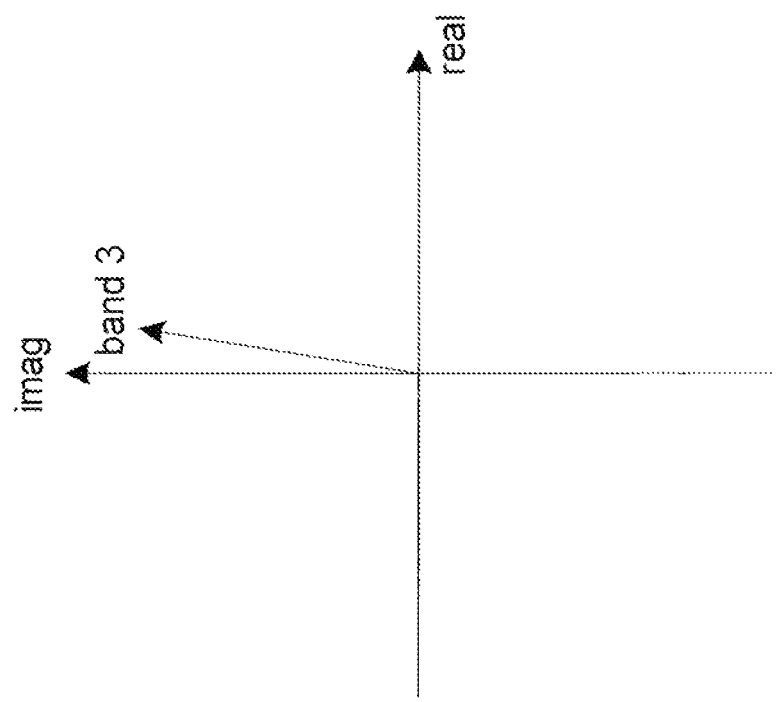
FIG. 7 is an exemplary illustration of a processed band 3.
Figure 8:
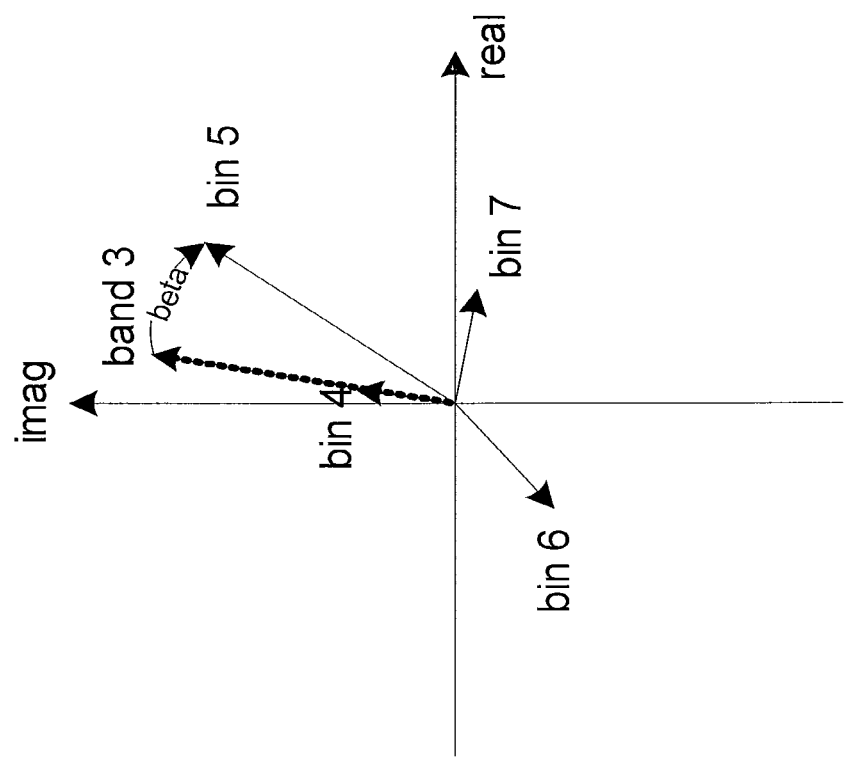
FIG. 8 is an exemplary restoration of bins from the exemplary processed band 3.

Assuming original sub-band 3 (of FIG. 6) contained echo and was processed to eliminate or minimise the unwanted or undesired additions (echo), processed sub-band 3 may be somewhat attenuated and rotated as shown in FIG. 7. For example, since bin 5 was designated as representative, it may be restored by rotating sub-band 3 clockwise by beta degrees to maintain the original relative phase to bin 4. The restored bin 5 maintains a new attenuated (or adjusted) magnitude. The remaining bins are then sealed and rotated to maintain their original relative phase and magnitude relationships to the restored bin as shown in FIG. 8.

Until the spectrum is restored, the original spectrum (or the representative data set) may be retained in a computer readable medium or memory so that the original relative magnitude and phase relationships may be maintained or restored in the decompressed spectrum. This retention potentially reduces audible artifacts that may be introduced by a compression scheme.

The system, methods, and descriptions described may be programmed in one or more controllers, devices, processors (e.g., signal processors). The processors may comprise one or more central processing units that supervise the sequence of micro-operations that execute the instruction code and data coming from memory (e.g., computer readable medium) that generate, support, and/or complete an operation, compression, or signal modifications. The dedicated applications may support and define the functions of the special purpose processor or general purpose processor that is customized by instruction code (and in some applications may be resident to vehicles). In some systems, a front-end processor may perform the complementary tasks of gathering data for a processor or program to work with, and for making the data and results available to other processors, controllers, or devices.

The systems, methods, and descriptions may program one or more signal processors or may be encoded in a signal bearing storage medium, a computer-readable medium, or may comprise logic 902 stored in a memory that may be accessible through an interface and is executable by one or more processors 904 as shown in FIG. 9 (in FIG. 9, N comprises an integer). Some signal-bearing storage medium or computer-readable medium comprise a memory that is unitary or separate (e.g., local or remote) from a device, programmed within a device, such as one or more integrated circuits, or retained in memory and/or processed by a controller or a computer. If the descriptions or methods are performed by software, the software or logic may reside in a memory resident to or interfaced to one or more processors, devices, or controllers that may support a tangible or visual communication interface (e.g., to a display), wireless communication interface, or a wireless system.

The memory may retain an ordered listing of executable instructions in a processor, device, or controller accessible medium for implementing logical functions. A logical function may be implemented through digital circuitry, through source code, or through analog circuitry. The software may be embodied in any computer-readable medium or signal-bearing medium, for use by, or in connection with, an instruction executable system, apparatus, and device, resident to system that may maintain persistent or non-persistent connections. Such a system may include a computer system, a processor-based system, or another system that includes an input and output interlace that may communicate with a publicly accessible or privately accessible distributed network through a wireless or tangible communication bus through a public and/or proprietary protocol.

A "computer-readable storage medium," "machine-readable medium," "propagated-signal" medium, and/or "signal-bearing medium" may comprise a medium that stores, communicates, propagates, or transports software or data for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory, such as a Random Access Memory (RAM), a Read-Only Memory (ROM), an Erasable Programmable Read-Only Memory (EPROM or Flash memory), or an optical fiber. A machine-readable medium may also include a tangible medium, as the software may be electronically stored as an image or in another format (e.g., through an optical scan), then compiled, and/or interpreted or otherwise processed. The processed medium may then be stored in a computer and/or machine memory.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
determining a representative magnitude value for the first band by the processor that comprises selecting a largest magnitude value of the multiple bins within the first band;
processing the first band using the representative phase value;
where the processing the first band further comprises transforming the first band of the signal by processing the first band at an adaptive filter, an acoustic echo canceller, a noise canceller, or a beam-former.

2. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
processing the first band using the representative phase value;
where the determining the representative phase value comprises selecting, as the representative phase value, the phase value of a bin within the first band that has a lowest frequency within the first band.

3. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
processing the first band using the representative phase value;
where the determining the representative phase value comprises selecting, as the representative phase value, the phase value of a bin within the first band that is at a center or the first band.

4. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
processing the first band using the representative phase value;
where the determining the representative phase value comprises averaging multiple phase values associated with the multiple bins within the first band to derive the representative phase value.

5. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
processing the first band using the representative phase value;
where the determining a representative phase value comprises averaging multiple phase values that applies a weighted average with weights set based on phase correlations common to the one or more of the multiple bins within the first band.

6. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band; and
processing the first band using the representative phase value;
where each of the plurality of frequency bins has a magnitude value, and determining a representative magnitude value for the first band by a processor programmed to determine the representative magnitude value based on the magnitude value of at least one of the multiple bins within the first band.

7. The method of claim 6, where the step of processing comprises transforming the first band of the signal by processing the first band at an adaptive filter, an acoustic echo canceller, a noise canceller, or a beam-former.

8. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative magnitude value and a phase value for the first band by a processor programmed to determine the representative phase value based on the phase value of at least one of the multiple bins within the first band; and
processing the first band using the representative phase value;
where the determining the representative magnitude value comprises selecting a largest magnitude value of the multiple bins within the first band.

9. A sub-band processing method, comprising:
transforming a signal into a plurality of frequency bins each having a phase value;
partitioning the plurality of frequency bins into a smaller number of bands;
defining a to include multiple bins of the plurality of frequency bins;
determining a representative phase value for the first band by a processor programmed to determine the representative phase value based on the phase value of at least one of the multiple bins within the first band; and
processing the first band using the representative phase value;
where the representative phase value is preserved from a first bin within the first band, and where a representative magnitude value is preserved from a second bin within the first band that is different than the first bin.

10. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band;
processing the first band using the representative phase value; and
rotating a vector associated with a representative magnitude value based on the representative phase value so that a phase of the vector matches the representative phase value.

11. A sub-band processing method, comprising:
transforming a signal into a plurality of frequency bins each having a phase value;
partitioning the plurality of frequency bins into a smaller number of bands;
defining a first band to include multiple bins of the plurality of frequency bins;
determining a representative phase value for the first band by a processor programmed to determine the representative phase value based on the phase value of at least one of the multiple bins within the first band;
processing the first band using the representative phase value; and
performing a lossy compression on the signal to generate a compressed version of the signal, where a representative magnitude value and the representative phase value are preserved in the compressed version of the signal to represent the first band, and where other magnitude and phase data from the multiple bins of the first band are not maintained in the compressed version of the signal.

12. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative magnitude value and a representative phase value for the first band based on the phase value of at least one of the multiple bins within the first band; and
   process the first band using the representative phase value;
where the processor determines the representative magnitude value for the first band by selecting a largest magnitude value of the multiple bins within the first band as the representative magnitude value.

13. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative phase value for the first band based on the phase value of at least one of the multiple bins within the first band; and
process the first band using the representative phase value;
where execution of the sub-band processing logic causes the processor to select, as the representative phase value, the phase value of a bin within the first band that has a lowest frequency within the first band.

14. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative phase value for the first band based on the phase value of at least one of the multiple bins within the first band; and
   process the first band using the representative phase value;
where execution of the sub-band processing logic causes the processor to select, as the representative phase value, the phase value of a bin within the first band that is at a center of the first band.

15. A sub-band processing system comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative phase value for the first band based on the phase value of at least one of the multiple bins within the first band; and
   process the first band using the representative phase value;
where execution of the sub-band processing logic causes the processor to average multiple phase values associated with the multiple bins within the first band to derive the representative phase value.

16. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative phase value for the first band based on the phase value of at least one of the multiple bins within the first band; and
   process the first band using the representative phase value;
where each of the plurality of frequency bins has a magnitude value, where execution of the sub-band processing logic causes the processor to determine a representative magnitude value for the first band based on the magnitude value of at least one of the multiple bins within the first band.

17. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;
   partition the plurality of frequency bins into a smaller number of bands;
   define a first band to include multiple bins of the plurality of frequency bins;
   determine a representative phase value for the first band based on the phase value of at least one of the multiple bins within the first band; and
   process the first band using the representative phase value;
   where the representative phase value is preserved from a first bin within the first band, and where the representative magnitude value is preserved from a second bin within the first band that is different than the first bin.

18. A sub-band processing system, comprising:
a computer memory that stores sub-band processing logic;
a processor coupled with the computer memory and configured to execute the sub-band processing logic stored in the computer memory, where execution of the sub-band processing logic causes the processor to:
   transform a signal into a plurality of frequency bins each having a phase value;

partition the plurality of frequency bins into a smaller number of bands;

define a first band to include multiple bins of the plurality of frequency bins;

determine a representative phase value for the first band based on the phase value of at least one of the multiple bins within the first band; and process the first band using the representative phase value;

where execution of the sub-band processing logic causes the processor to rotate a vector associated with the representative magnitude value based on the representative phase value so that a phase of the vector matches the representative phase value.

19. A sub-band processing system, comprising:

a computer memory that stores sub-band processing logic;

a processor coupled with the computer memory and configured to execute the sub-band processing logic stored in the computer memory, where execution of the sub-band processing logic causes the processor to:

transform a signal into a plurality of frequency bins each having a phase value;

partition the plurality of frequency bins into a smaller number of bands;

define a first band to include multiple bins of the plurality of frequency bins;

determine a representative phase value for the first band based on the phase value of at least one of the multiple bins within the first band; and process the first band using the representative phase value;

where execution of the sub-band processing logic causes the processor to perform a lossy compression on the signal to generate a compressed version of the signal, where the representative magnitude value and the representative phase value are preserved in the compressed version of the signal to represent the first band, and where other magnitude and phase data from the multiple bins of the first band are not maintained in the compressed version of the signal.

20. A non-transitory computer-readable medium with instructions stored thereon, where the instructions are executable by a processor to cause the processor to perform the steps of:

transforming a signal into a plurality of frequency bins each having a phase value;

partitioning the plurality of frequency bins into a smaller number of bands;

defining a first band to include multiple bins of the plurality of frequency bins;

determining a representative phase value for the first band based on the phase value of at least one of the multiple bins within the first band; and processing the first band using the representative phase value where the representative phase value for the first band comprises an average of multiple phase values associated with the multiple bins within the first band.

* * * * *

UNITED STATES PATENT AND TRADEMARK OFFICE
CERTIFICATE OF CORRECTION

| | | |
|---|---|---|
| PATENT NO. | : 9,225,318 B2 | |
| APPLICATION NO. | : 13/901741 | |
| DATED | : December 29, 2015 | |
| INVENTOR(S) | : Shreyas Paranjpe | |

It is certified that error appears in the above-identified patent and that said Letters Patent is hereby corrected as shown below:

<u>In the Claims</u>

In column 8, claim 3, line 67, before "the first band." replace "or" with --of--.

In column 10, claim 9, line 14, after "defining a" insert --first band--.

Signed and Sealed this
Nineteenth Day of April, 2016

Michelle K. Lee
*Director of the United States Patent and Trademark Office*